Oct. 3, 1961 C. H. LEWIS, JR 3,003,060

TELEVISION TUNER

Filed Oct. 22, 1956 2 Sheets-Sheet 1

INVENTOR
CHALMER H. LEWIS Jr.

BY
Mason, Kolehmainen, Rathburn and Wyss.
ATTORNEYS

Oct. 3, 1961 C. H. LEWIS, JR 3,003,060

TELEVISION TUNER

Filed Oct. 22, 1956 2 Sheets-Sheet 2

INVENTOR
CHALMER H. LEWIS Jr.
BY
Mason, Kolehmainen, Rathburn and Wyss
ATTORNEYS 3,003,060

TELEVISION TUNER

Chalmer H. Lewis, Jr., Bloomington, Ind., assignor to Sarkes Tarzian, Inc., Bloomington, Ind., a corporation of Indiana Filed Oct. 22, 1956, Ser. No. 617,399
2 Claims. (Cl. 250—20)

The present invention relates to television tuners, and, more particularly, to television tuners which are adapted to receive both V.H.F. and U.H.F. television signals.

Under present standards, commercial television transmitting stations are assigned to both the so-called V.H.F. or very high frequency band of 54 to 88 megacycles and 174 to 216 megacycles (channels 2 to 13, inclusive) and the U.H.F. band of 470 to 890 megacycles (channels 14 to 83, inclusive). Most of the tuning arrangements adapted to receive signals in both the V.H.F. and U.H.F. bands have involved a V.H.F. tuner adapted to receive the V.H.F. stations and a U.H.F. tuner adapted to receive the U.H.F. stations, the V.H.F. tuner being employed as an IF amplifier for the U.H.F. tuner during U.H.F. reception. Such an arrangement is shown, for example, in Krepps Patent No. 2,665,377 which issued January 5, 1954, and is assigned to the same assignee as the present invention.

In such prior art arrangements the RF amplifier and mixer in the V.H.F. tuner are employed as IF amplifiers for U.H.F. reception. While such an arrangement is entirely satisfactory for its intended purpose, the switching arrangements required to change over the RF amplifier to function as an IF amplifier are quite complicated and changes may occur in the band pass characteristic of this amplifier over the U.H.F. band. Such changes in band pass characteristics may be particularly disturbing in the case of reception for color television signals.

It is, therefore, an object of the present invention to provide an improved V.H.F.-U.H.F. television tuning system wherein the V.H.F. local oscillator and mixer are operated as intermediate frequency amplifiers for the intermediate frequency signal from a preceding U.H.F. tuner during U.H.F. reception.

It is another object of the present invention to provide a new and improved V.H.F-U.H.F. television tuning system wherein the V.H.F. local oscillator and mixer may be operated as intermediate frequency amplifiers for an intermediate frequency signal derived from the preceding U.H.F. tuner while providing AGC action for the mixer stage during U.H.F. reception so that the band pass characteristic of the preceding crystal mixer stage of the U.H.F. tuner is not affected by the AGC control voltage.

A further object of the present invention is to provide a new and improved V.H.F. television tuner which is adapted to function as an intermediate frequency amplifier with a preceding U.H.F. tuner and wherein switching for U.H.F. reception is substantially simpler and less expensive than prior art arrangements involving operation of the RF stage of the V.H.F. tuner as an intermediate frequency amplifier for U.H.F. reception.

A still further object of the present invention is to provide a new and improved V.H.F. tuner provided with an RF amplifier having a tunable output circuit comprising a wafer switch section having a rotor and a plurality of stator contacts between which are connected incremental inductances wherein an energizing potential may be supplied to a preceding U.H.F. tuner through one of said stator switch contacts for U.H.F. reception.

Briefly, in accordance with one phase of the invention, the V.H.F. television tuner is provided with a local oscillator and mixer for V.H.F. reception, both of which stages are operated as intermediate frequency amplifiers for signals derived from a preceding U.H.F. tuner during U.H.F. reception. The local oscillator stage preferably employs a triode tube which acts as a low noise input stage for the preceding U.H.F. tuner. If desired this triode stage may be operated as a grounded grid stage for intermediate frequency signal amplification so that the band pass characteristics for U.H.F. reception is substantially constant. In accordance with another feature of the invention, a switching arrangement is employed to apply AGC voltage to the V.H.F. mixer when it is operated as an IF amplifier for U.H.F. reception so that the band pass characteristics of the tuner is rendered less susceptible to changes due to the AGC control voltage. In addition, a single capacitor connected between the oscillator and the mixer stages acts as both an oscillation injection capacitor for V.H.F. reception and as a signal coupling capacitor for U.H.F. reception.

In accordance with a further feature of the invention, the oscillator and mixer tubes are operated as a cascode amplifier for U.H.F. reception so that a relatively few number of components is required to convert these stages for V.H.F. or U.H.F. reception.

The invention, both as to its organization and method of operation, together with further objects and advantages thereof, will best be understood by reference to the following specification taken in connection with the accompanying drawings, in which.

Figure 1:
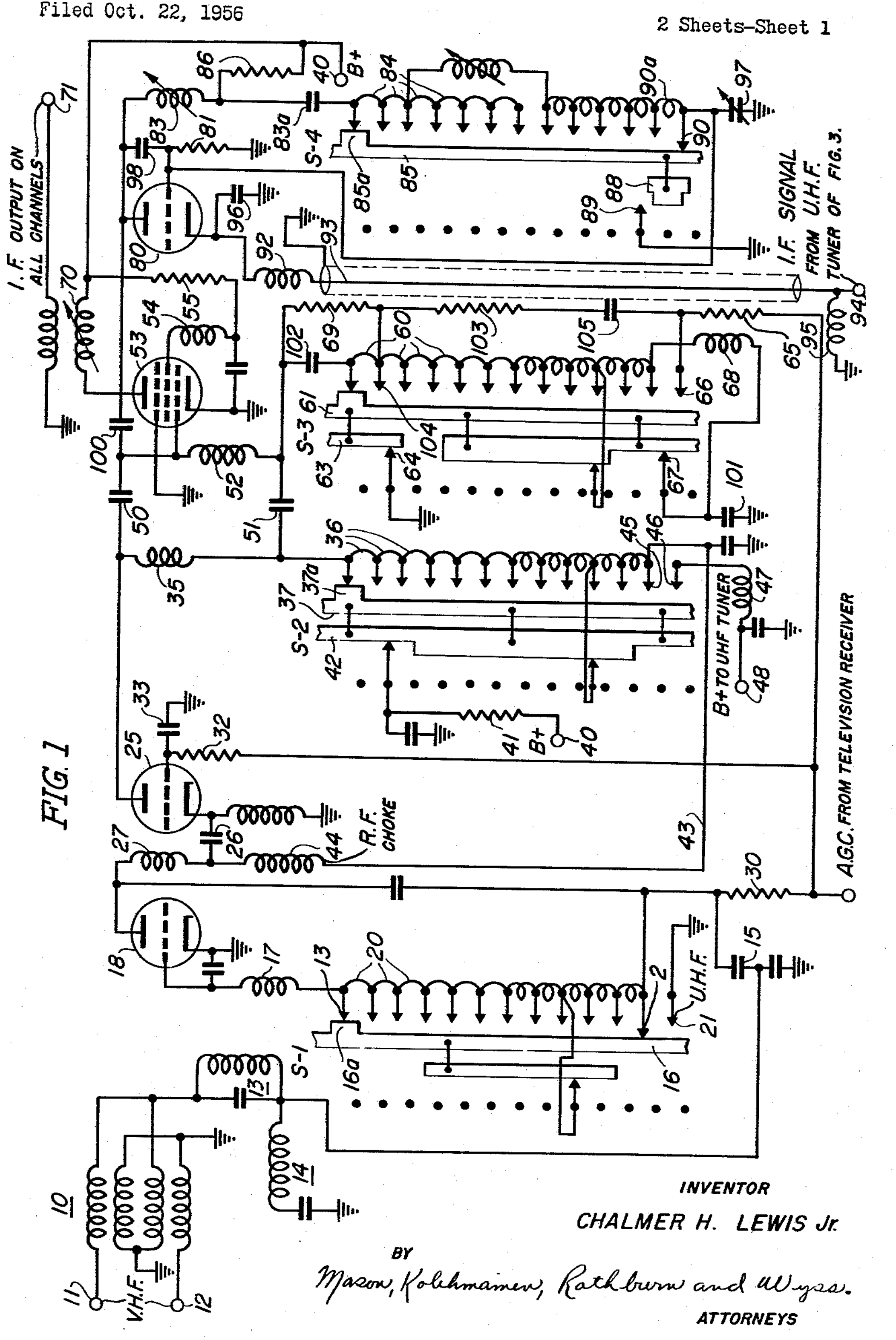
FIG. 1 is a schematic diagram of a V.H.F. television tuner embodying the principles of the present invention.

Referring now to the drawings, and more particularly, to FIG. 1 thereof, the V.H.F. tuner therein illustrated is provided with an antenna input matching device indicated generally at 10 which is adapted to receive V.H.F. television signals which are impressed upon the input terminals 11 and 12 of the input matching device 10. The received signals are transmitted through the trap circuits 13 and 14, through the coupling condenser 15, the front rotor 16 of a wafer switch section S–1 and the channel 13 coil 17 to the control grid of the triode section 18 of an RF amplifier stage. The channel selector switch of the tuner of FIG. 1 comprises the wafer sections S–1, S–2, S–3 and S–4. All of these switch sections are shown in developed form and in the channel 13 position, it being understood that upward movement of the switch rotors to the next position places the wafer switch sections in the U.H.F. tuner position which falls between the channel 2 and channel 13 positions on the station selector switch.

A plurality of RF input incremental tuning inductances 20 are connected between individual stator contacts associated with the switch rotor 16 so that these inductive increments are successively inserted into the input circuit of the tube 18 for tuning to successively lower frequency television stations. It will be noted that when the switch rotor 16 is in the U.H.F. position the tongue portion 16a thereof is connected to the U.H.F. stator contact 21 which is in turn connected to ground so that the input signals coupled through the matching transformer 10 are grounded and are not coupled to the input circuit of the tube 18 during U.H.F. reception.

The RF amplifier stage includes a second triode tube 25, the cathode of which is connected through the coupling condenser 26 and peaking coil 27 to the plate of the preceding triode tube 18 so that the tubes 18 and 25 are connected as a well known shunt fed cascode amplifier wherein the output signal from the tube 18 is impressed upon the cathode circuit of the second triode tube 25. An automatic gain control voltage from the associated television receiver is applied to the grid of the tube 18 through the resistor 30, the incremental tuning inductances 20 and the inductance 17 to the control grid of the tube 18 and this automatic gain control voltage is also impressed upon the control grid of the triode 25 through the resistor 32, this latter control grid being connected to ground for alternating current signals through the condenser 33. The plate circuit of the tube 25 is tuned by means of the channel 13 inductance 35 and the incremental tuning inductances 36 which are connected between the stator contacts associated with the rear rotor section 37 of a second wafer switch section S–2. The energizing potential for the plate circuits of the tubes 18 and 25 is supplied from a B+ terminal 40 through the decoupling resistor 41, the front rotor section 42 of the switch section S–2, the rear rotor section 37, the incremental tuning inductances 36 and the inductance 35 to the plate of the tube 25. This energizing potential is also supplied through the incremental tuning inductances 36, over the conductor 43 and through the choke coil 44 and the peaking coil 27 to the plate of the first triode tube 18.

In order to deenergize the RF amplifier stage during U.H.F. reception, the wafer switch section S–2 is so designed that this deenergization is accomplished automatically while supplying the B+ potential to the associated U.H.F. tuner. More specifically, when the tongue 37*a* of the rotor section 37 moves from the stator contact 45 to the stator contact 46 the B+ energizing potential is removed from both of the triode RF amplifier stages 18 and 25 and is supplied by way of the contact 46 and the filter coil 47 to the B+ input terminal 48 of the U.H.F. tuner shown and described in more detail in connection with FIG. 2.

The V.H.F. signals amplified in the above described RF amplifier are coupled through the condenser 50 to the control grid of a pentode mixer stage 53, the cathode of which is grounded and the screen electrode of which is connected through the compensating coil 54 and the screen resistor 55 to the B+ terminal 40. The control grid or input circuit of the mixer tube 53 is tuned by means of the channel 13 inductance 52 and the incremental inductances 60 which are connected between the individual stator contacts associated with the rear rotor section 61 of a third wafer switch section S–3, a condenser 51 being between the coils 35 and 52 to provide increased coupling for the low frequency channels. In the V.H.F. positions of the station selector switch the rotor section 61 is grounded through the front rotor section 63 and the stator terminal 64 which is connected to ground, a resistor 69 being connected to the condenser 51 and through the coil 52 to the first grid of tube 53 to provide bias for the tube 53 when this tube is operated as a mixer during V.H.F. reception by rectification of the local oscillator signal impressed upon the first grid of the tube 53 from the tube 80. However, during U.H.F. reception an automatic gain control voltage is supplied from the associated television receiver to the control grid of the tube 53, as will be described in more detail hereinafter. An IF output transformer 70 is connected in the plate circuit of the mixer stage 63 and is arranged to provide a suitably matched intermediate frequency output signal at the output terminal 71 which may be further amplified in the intermediate frequency amplifier of the associated television receiver, as will be readily understood by those skilled in the art.

The local oscillator of the V.H.F. tuner comprises a triode tube 80 the control grid of which is connected to ground through the resistor 81 during V.H.F. reception. The tunable tank circuit of the local oscillator comprises the channel 13 inductance 83, which is connected to the plate of the triode tube 80 and the incremental tuning inductances 84 which are connected between individual stator contacts associated with the rear rotor 85 of the oscillator switch wafer section S–4. An energizing potential for the oscillator tube 80 is supplied through the anode supply resistor 86 and the inductance 83 to the plate of the tube 80.

During U.H.F. reception a 44 megacycle IF tuning inductance 90*a* is connected in series with the above described tunable tank circuit to the plate of the tube 80 so that this plate circuit is tuned to the intermediate frequency signal and the tube 80 is operated as a grounded grid amplifier for the intermediate frequency signal developed by the preceding U.H.F. tuner. More particularly, during U.H.F. reception the rear rotor section 88 of the switch wafer S–4 is connected to ground through the stator contact 89 so that the control grid of the tube 80 is directly connected to ground through the rotor sections 85 and 88 and the stator contact 90, the bottom end of the inductance 90*a* also being connected to ground through the contact 89. The cathode of the tube 80 is connected through the inductance 92 and a shielded cable 93 to the IF input terminal 94 from the preceding U.H.F. tuner, an inductance 95 being connected from the conductor 93 to ground to complete the cathode space current path of the tube 80 and provide a D.C. return for the crystal mixer in the preceding U.H.F. tuner. A condenser 96 is connected from the cathode of the tube to ground and this condenser together with the inductance 92 and the shunt capacity of the cable 93 forms a low pass filter circuit which functions to transmit the intermediate frequency signal from the preceding U.H.F. tuner during U.H.F. reception but effectively grounds the cathode of the triode tube 80 when this tube is operated as a local oscillator during V.H.F. reception.

In order to tune the local oscillator in each station position of the station selecting switch, there is provided a vernier tuning condenser 97 which is connected between the common stator contact 90 and ground during V.H.F. reception. However, during U.H.F. reception the contact 90 is connected to ground so that the vernier tuning condenser 97 is short circuited. At the same time the temperature compensating condenser 98, which is connected between the plate and control grid of the tube 80 for V.H.F. reception, is connected to ground through the stator contacts 90 and 89 of the switch section S–4. Accordingly, for U.H.F. reception the tube 80 acts as an intermediate frequency amplifier for the IF signal from the U.H.F. tuner and the amplified IF signal developed at the plate of the tube 80 is coupled through the condenser 100 to the control grid of the pentode tube 53. In this connection it will be noted that all of the switching necessary to convert the triode tube 80 from a local oscillator during V.H.F. reception to a 44 megacycle IF amplifier during U.H.F. reception is accomplished in the single wafer section S–4 so that a substantially simplified and economical switching arrangement is provided wherein additional switches for U.H.F. changeover are not required. It will also be noted that the vernier tuning condenser 97 is short circuited for U.H.F. reception so that the vernier tuning knob associated with the condenser 97 may be employed as a U.H.F. station selector control as described in detail in the above identified Krepps Patent No. 2,665,377.

The tube 53 is also operated as an IF amplifier for U.H.F. reception and the input circuit of the tube 53 is tuned to 44 megacycles during U.H.F. reception by means of the tuning inductance 68, which is connected in series with the incremental tuning inductances 60, the condenser 102 and the channel 13 tuning inductance 52 to the control grid of the tube 53. More specifically, when the switch section S–3 is in the U.H.F. position the stator contact 66 is connected through the switch rotors 61 and 63, and through the stator contacts 67 to the bottom end of the IF tuning inductance 68, a bypass condenser 101 being operative in the U.H.F. position to bypass the bottom end of the inductance 68 to ground for alternating current voltages. The upper end of the coil 68 is connected to the bottom one of the incremental tuning inductances 60, and the condenser 102 is connected from the top one of the inductances 60 through the inductance 52 to the control grid of the tube 53 so that the signal input circuit of the tube 53 is tuned to 44 megacycles in the U.H.F. position of the channel selector switch. The condenser 102 matches the above described tank circuit to the grid of the tube 53 and also acts as a D.C. blocking condenser across the resistor 69 during V.H.F. reception so that the resistor 69 can function properly as a bias resistor for the tube 53 when operated as a mixer. In order to provide damping for the 44 megacycle inductance 68 and the incremental tuning inductances 60 during U.H.F. reception, there is provided a damping resistor 103 which is connected from the stator contact 104 in series with the blocking condenser 105 to the stator contact 66. In the U.H.F. position the resistor 103 is thus connected in parallel across all but the uppermost one of the incremental tuning inductances 60 and the 44 megacycle inductance 68 so as to provide the desired bandpass characteristic for the input circuit of the tube 53 when this tube is operated as an IF amplifier during U.H.F. reception.

In accordance with an important feature of the invention, the triode tube 80 is operated at full gain during U.H.F. reception while facilities are provided for applying an automatic gain control voltage to the tube 53 in the U.H.F. position of the station selector switch. This arrangement has the advantage that the triode tube 80 provides a substantially constant reflected load on the crystal mixer of the preceding U.H.F. tuner so that the bandpass characteristic to the intermediate frequency stages remains substantially constant. Furthermore, since the tube 80 is operated at full gain at all times for the intermediate frequency signal from the preceding U.H.F. tuner the noise factor through to the plate of the tube 80 is substantially improved over an arrangement wherein an AGC voltage is employed to control the tube 80 when this tube is operated as an IF amplifier for U.H.F. reception. Considering the manner in which an AGC voltage is impressed upon the control grid of the pentode tube 53 and this tube is operated as an IF amplifier during U.H.F. reception, the AGC voltage from the associated television receiver is coupled through the resistor 65, the stator contact 66, the switch rotors 61 and 63, the stator contact 67, the 44 megacycle tuning inductance 68, the incremental tuning inductances 60, the resistor 69 and the channel 13 tuning inductance 52 to the control grid of the tube 53 so that the gain of this tube can be varied in accordance with the received signal strength to provide the customary automatic gain control action. In this connection it will be noted that when the station selector switch is in a position other than the U.H.F. position the automatic gain control voltage is not applied to the control grid of the tube 53 since the stator contact 66 is under these conditions, not connected to the rotor 61 and the condenser 105 functions to block the D.C. automatic gain control voltage and prevent it from being impressed upon the control grid of the tube 53.

Figure 2:
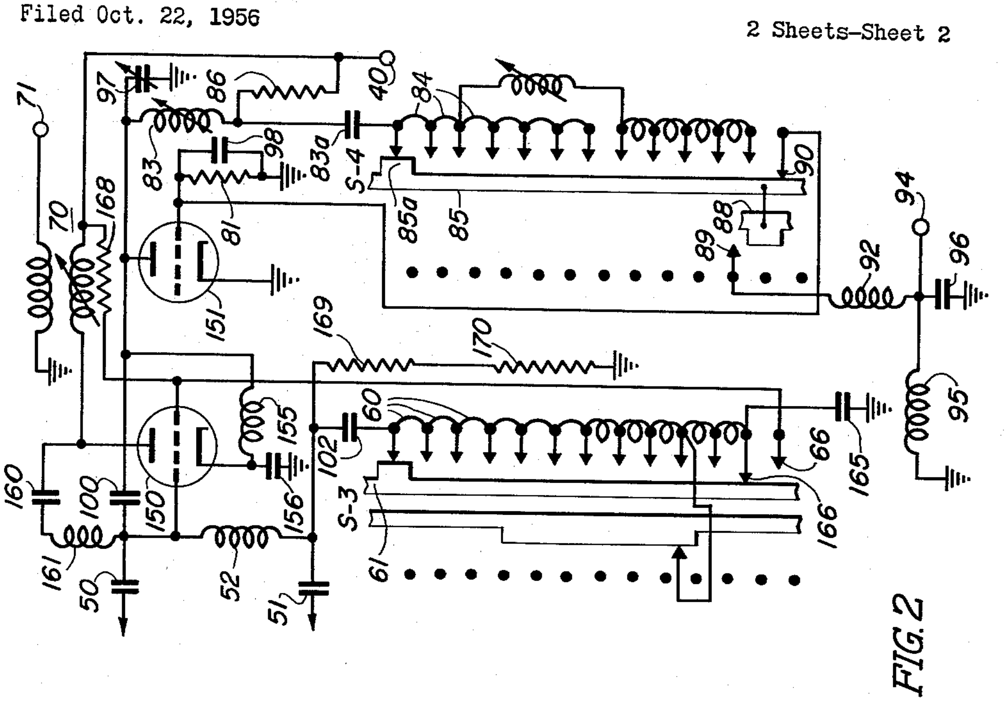
FIG. 2 is a fragmentary schematic diagram of an alternative embodiment of the invention.
Figure 3:
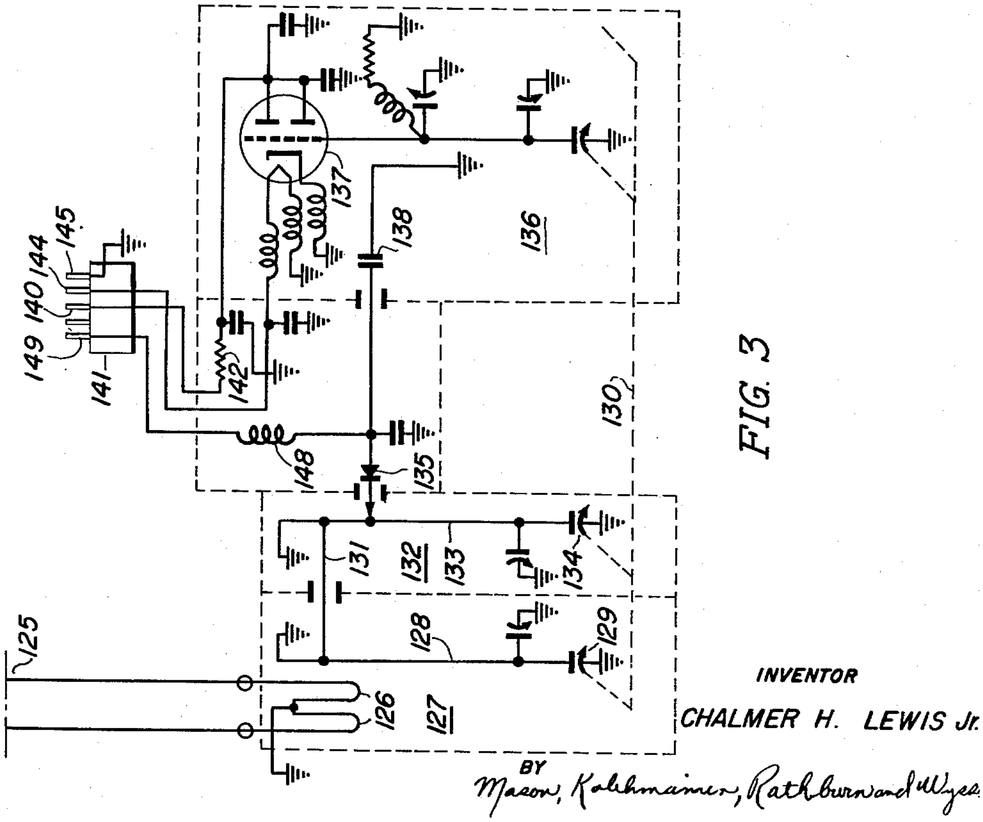
FIG. 3 is a schematic diagram of a U.H.F. tuner which may be employed with the V.H.F. tuner of either FIG. 1 or FIG. 2.

In FIG. 3 of the drawings there is shown a typical U.H.F. tuner arrangement which may be employed with the V.H.F. tuner arrangements of either FIG. 1 or FIG. 2 to provide the combined V.H.F.-U.H.F. tuning system of the present invention. The mechanical and electrical arrangements of the tuner shown in FIG. 3 are described in detail in a copending application of Stanley R. Meadows, Chalmers E. Lewis and Carl E. Pearson, Serial No. 463,416, filed October 20, 1954, so that a detailed description of this U.H.F. tuner is considered unnecessary herein. However, for the purposes of the present invention, it may be stated that U.H.F. signals received by the U.H.F. antenna system 125 are coupled to the input coupling loops 126 in the U.H.F. tuning compartment 127, the tuning inductance bar 128 in the compartment 127 being tuned by means of the variable condenser 129 the rotor of which is connected to the station selector shaft 130 of the U.H.F. tuner. The U.H.F. energy is coupled through the connection 131 to the mixer tuning compartment 132 wherein the inductance bar 133 is tuned by means of the variable condenser 134 the rotor of which is also connected to the shaft 130. A crystal mixer 135 is connected to the inductance bar 133 and is also supplied with a local oscillator signal developed in the local oscillator tuning compartment 136 by the local oscillator tube 137, this local oscillator signal being coupled through the condenser 138 to the crystal mixer 135. A B+ energizing potential is supplied to the terminal 140 of the plug 141 and is coupled through the resistor 142 to the plate circuit of the oscillator tube 137. If the V.H.F. tuner of FIG. 1 is employed the terminal 48 thereof would be connected to the pin 140 of the plug 141 so that a B+ energizing potential would be supplied to the U.H.F. tuner of FIG. 3 in the U.H.F. tuner position of the station selector switch of the V.H.F. tuner of FIG. 1. A 6.3 volt alternating current voltage is also supplied to the pin 144 of the plug 141 to energize the filament of the local oscillator tube 137, the pin 145 of the plug 141 being connected to ground to complete a ground connection between the V.H.F. and U.H.F. tuners. The 44 megacycle intermediate frequency signal developed by the crystal mixer 135 is coupled through the inductance 148 to the pin 149 of the plug 141 and would be connected, for example, to the input terminal 94 of the V.H.F. tuner shown in FIG. 1. As described above in connection with FIG. 1, the triode tube 80 of the V.H.F. tuner shown in FIG. 1 is operated at constant gain during U.H.F. reception so that the reflected load of this tube on the crystal mixer 135 is substantially constant throughout the U.H.F. band and does not vary with the received signal strength so that the IF band pass characteristic remains substantially constant throughout the U.H.F. band, even though AGC action is provided by virtue of the AGC voltage which is applied to the tube 53 during U.H.F. reception.

Referring now to FIG. 2 of the drawings, there is shown therein a portion of a V.H.F. tuner constituting an alternative embodiment of the present invention wherein a double triode tube comprising the two triode sections 150 and 151 are employed for the mixer and local oscillator stages, respectively, of the V.H.F. tuner. In the U.H.F. station selecting position of the channel selector switch the tubes 150 and 151 are collectively operated as a combined grounded cathode to grounded grid amplifier, commonly known as a cascode type amplifier for the 44 megacycle IF signal from the preceding U.H.F. tuner. In the embodiment of FIG. 2 certain of the circuit components are identical to those described in detail in connection with the V.H.F. tuner of FIG. 1 and corresponding reference characters have been given to these components in FIG. 2.

Considering first the circuit associated with the triode tube 151, the cathode of this tube is connected to ground and the control grid thereof is connected through the resistor 81 to ground, a temperature compensating capacitor 98 being connected across the resistor 81 for the same purposes as in the tuner of FIG. 1. The plate of the tube 151 is connected through the channel 13 tuning inductance 83 and through the condenser 83a to the incremental tuning inductances 84. In order to connect the intermediate frequency signal from the preceding U.H.F. tuner to the control grid circuit of the tube 151 during U.H.F. reception, the input terminal 94 is connected through the inductance 92 to the stator contact 89 and in the U.H.F. position of the station selector switch the rotor 88 is connected to the stator contact 89 so as to supply the intermediate frequency signal through the rotors 88 and 85 and the stator contact 90 to the control grid of the triode tube 151. In order to remove the incremental tuning inductances 84 from the grid circuit of the triode tube 151 when this tube is used as an IF amplifier for U.H.F. reception, the 44 megacycle coil 90*a* of FIG. 1 is omitted in the tuner of FIG. 2 so that when the rotor tongue 85*a* contacts the stator contact 90 the incremental tuning inductances 84 are removed from the grid circuit of the tube 151. The vernier tuning condenser 97 is permanently connected between the plate of the oscillator tube 151 and ground so as to provide the customary vernier tuning action in each V.H.F. station selecting position of the channel selector switch. During U.H.F. reception the tuning condenser 97 has no effect on the 44 megacycle IF signal due to the shunting effect of the cathode circuit of the tube 150. The plate of the tube 151 is connected through the inductance coil 155 to the cathode of the tube 150 and this cathode is also connected to ground through a condenser 156. This plate to cathode connection between the tubes 151 and 150 is effective to connect these tubes in the desired cascode relation for U.H.F. reception, as will be described in more detail hereinafter. However, during V.H.F. reception the inductance coil 155 and the condenser 156 have sufficient filtering action to prevent the local oscillator signal from being coupled from the plate of the tube 151 to the cathode of the tube 150, this signal being instead coupled through the condenser 100 to the control grid of the triode tube 150 which is operated as a mixer tube during V.H.F. reception.

Considering now the circuitry associated with the tube 150, in the channel 13 position shown in FIG. 2 the control grid circuit of the tube 150 is tuned by means of the inductance 52 and in successively lower frequency channel positions of the switch section S–3 successive ones of the incremental tuning inductances 60 are inserted in series with the condenser 102 and the inductance 52 to the control grid of the tube 150. The amplified V.H.F. signal from the preceding radio frequency amplifier is coupled through the condenser 50 to the control grid of the tube 150, and to some extent through the coupling condenser 151 for the lower frequency channels, and the tube 150 acts as a triode mixer to develop the desired intermediate frequency signal at the plate thereof which is coupled through the transformer 70 to the IF output terminal 71. In order to prevent plate to grid feedback in the triode tube 150 at 40 megacycles there is provided a blocking condenser 160 and neutralizing inductance 161 which are connected in series between the plate and control grid of the tube 160, the inductance 161 resonating with the grid to plate capacitance of the tube 150 at 40 megacycles to prevent the undesired feedback.

During U.H.F. reception the tubes 150 and 151 are operated as a cascode amplifier wherein the tube 151 acts as a grounded cathode stage having a gain of one which drives the cathode of the tube 150 which is operated as a grounded grid amplifier for the intermediate frequency signal from the preceding U.H.F. tuner. In order to ground the control grid of the tube 150 for the intermediate frequency signal a bypass condenser 165 is connected to the stator contact 166 associated with the switch rotor 61. The stator contact 166 is longer than the stator contacts associated with the incremental tuning inductances 60 and contacts the rotor 61 at all times. Accordingly, in U.H.F. position of the channel selector switch the bypass condenser 165 is connected through the stator contact 166, the rotor 61 and the stator contact 66 to the control grid of the tube 150 to bypass to ground any signals of intermediate frequency. At the same time it is necessary to bias the control grid of the tube 150 positively with respect to ground insofar as the D.C. operation of the tubes 150 and 151 is concerned. This is accomplished by means of the resistor 168 which is connected between the B+ terminal 40 and the control grid of the tube 150, the series connected resistors 169 and 170 being connected from the bottom end of the tuning inductance 52 to ground. With this arrangement the resistors 168, 169 and 170 constitute a voltage divider and are so chosen that the control grid of the tube 150 is operated at the correct positive D.C. potential with respect to ground.

During U.H.F. operation, the tubes 150 and 151 are operated as a cascode amplifier and the intermediate frequency signal impressed upon the control grid of the tube 151 is coupled to the cathode of the tube 150 through the low pass filter network including the inductance 155 and the condenser 156. Also, during U.H.F. reception the control grid of the tube 150 is connected to ground through the bypass condenser 165 so that any intermediate frequency signal which may be coupled through the V.H.F. oscillator coupling condenser 100 is bypassed to ground through the condenser 165. However, during V.H.F. reception the relatively large amplitude oscillator signal which is coupled from the plate of the tube 151 to the control grid of the tube 150 through the oscillator coupling condenser 100 is rectified in the grid to cathode circuit of the tube 150 to provide the required slight negative bias for the control grid of the tube 150 when this tube is operated as a mixer. In this connection it will be understood that the resistors 168, 169 and 170 are of relatively high resistance so as to permit the above described rectification of the oscillator signal during V.H.F. reception while establishing the positive D.C. level for the control grid of the tube 150 necessary when this tube is operated as the second section of the cascode IF amplifier.

With the arrangement of FIG. 2 a low noise intermediate frequency amplifier circuit is provided for intermediate signals from the preceding U.H.F. tuner since both the tubes 151 and 150 are triodes. Furthermore, when AGC is applied to the RF amplifier of the V.H.F. tuner during V.H.F. reception to reduce the gain thereof, the embodiment of FIG. 2 provides a better noise performance for V.H.F. reception since under these conditions the triode mixer 150 will contribute less noise than the pentode mixer stage 53 in the tuner of FIG. 1.

While there have been described what are at present considered to be the preferred embodiments of the invention, it will be understood that various modifications may be made therein which are within the true spirit and scope of the invention as defined in the appended claims.

What is claimed as new and desired to be secured by Letters Patent of the United States is:

1. A V.H.F-U.H.F. television tuning system comprising in combination a radio frequency amplifier for received V.H.F. signals, a signal mixer stage having a tunable signal input circuit, means coupling said signal input circuit with said radio frequency amplifier, a dual purpose stage connected with said mixer including a triode tube, first circuit means including a tunable frequency determining tank circuit for connecting said dual purpose stage to operate as a V.H.F. local oscillator, second circuit means for connecting said dual purpose stage to operate as an intermediate frequency amplifier, means providing a signal input connection for said dual purpose stage for applying intermediate frequency signals to be derived from a preceding U.H.F. converter to said dual purpose stage, means providing an automatic gain control signal input connection for said mixer stage for applying an automatic gain control signal to said mixer stage, and switch means for selectively establishing said first or said second circuit means in said V.H.F.-U.H.F. tuning system and for supplying an automatic gain control signal to said mixer stage with said dual purpose stage connected to operate as an intermediate frequency amplifier, said automatic gain control signal being supplied to said mixer stage independently of said dual purpose stage so that said dual purpose stage is operated at full gain during U.H.F. reception.

2. A V.H.F.-U.H.F. television tuning system comprising in combination a radio frequency amplifier for received V.H.F. signals, a signal mixer stage having a tunable signal input circuit, means coupling said signal input circuit with said radio frequency amplifier, a dual purpose stage connected with said mixer including a triode tube, first circuit for connecting said dual purpose stage to operate as a V.H.F. local oscillator, second circuit means for connecting said dual purpose stage to operate as an intermediate frequency amplifier, means providing a signal input connection for said dual purpose stage for applying intermediate frequency signals to be derived from a preceding U.H.F. converter to said dual purpose stage, and switch means for selectively establishing said first or said second circuit means in said V.H.F.-U.H.F. tuning system and for supplying an automatic gain control signal through at least a portion of said tunable signal input circuit to said mixer stage when said dual purpose stage is connected to operate as an intermediate frequency amplifier, said automatic gain control signal being supplied to said mixer stage independently of said dual purpose stage so that said dual purpose stage is operated at full gain during U.H.F. reception.

References Cited in the file of this patent

UNITED STATES PATENTS 2,709,788 Schmidt ---------------- May 31, 1955
2,806,945 Wingert ---------------- Sept. 17, 1957